United States Patent
Kim

(10) Patent No.: US 7,098,134 B2
(45) Date of Patent: Aug. 29, 2006

(54) METHOD FOR FABRICATING SEMICONDUCTOR DEVICE

(75) Inventor: Jung Joo Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,839

(22) Filed: Dec. 29, 2004

(65) Prior Publication Data

US 2005/0153116 A1   Jul. 14, 2005

(30) Foreign Application Priority Data

Dec. 30, 2003  (KR) ............... 10-2003-0100978

(51) Int. Cl.
*H01L 21/44* (2006.01)
*H01L 21/441* (2006.01)
*H01L 21/443* (2006.01)

(52) U.S. Cl. .......... 438/687; 438/653; 257/E21.019; 257/E21.584

(58) Field of Classification Search .......... 438/687, 438/653; 257/E21.016, E21.019, E29.143, 257/E29.146, E21.584, E21.577
See application file for complete search history.

(56) References Cited

U.S. PATENT DOCUMENTS

| | | | |
|---|---|---|---|
| 6,069,068 A | 5/2000 | Rathore et al. | |
| 6,130,161 A | 10/2000 | Ashley et al. | |
| 6,180,523 B1 * | 1/2001 | Lee et al. | 438/678 |
| 6,235,633 B1 * | 5/2001 | Jang | 438/675 |
| 6,248,632 B1 | 6/2001 | Jang et al. | |
| 6,258,710 B1 | 7/2001 | Rathore et al. | |
| 6,287,954 B1 | 9/2001 | Ashley et al. | |
| 6,331,485 B1 * | 12/2001 | Miyamoto | 438/653 |
| 6,348,731 B1 | 2/2002 | Ashley et al. | |
| 6,461,914 B1 | 10/2002 | Roberts et al. | |
| 6,476,454 B1 | 11/2002 | Suguro | |
| 6,583,021 B1 | 6/2003 | Song | |
| 6,607,958 B1 | 8/2003 | Suguro | |
| 6,750,541 B1 | 6/2004 | Ohtsuka et al. | |
| 6,764,899 B1 | 7/2004 | Yoon | |
| 6,838,352 B1 | 1/2005 | Zhao | |
| 6,949,461 B1 * | 9/2005 | Malhotra et al. | 438/643 |
| 6,992,005 B1 | 1/2006 | Ohtsuka et al. | |
| 2001/0025999 A1 | 10/2001 | Suguro | |
| 2002/0158338 A1 | 10/2002 | Ohtsuka et al. | |
| 2003/0011043 A1 | 1/2003 | Roberts | |
| 2003/0027393 A1 | 2/2003 | Suguro | |
| 2004/0087135 A1 * | 5/2004 | Canaperi et al. | 438/628 |
| 2004/0188839 A1 | 9/2004 | Ohtsuka et al. | |
| 2004/0192021 A1 * | 9/2004 | Li | 438/622 |

FOREIGN PATENT DOCUMENTS

KR   2002-0003003 A   1/2002

OTHER PUBLICATIONS

Chan Lim; Method for Forming Hafnium Oxide Layer Using Atomic Layer Deposition Method; Korean Patent Abstracts; Publication No. 10-2002-0003003, Oct. 1, 2002, 9 pages; Korean Intellectual Property Office, Korea.

(Continued)

*Primary Examiner*—Caridad Everhart
(74) *Attorney, Agent, or Firm*—Andrew D. Fortney

(57) ABSTRACT

A method of fabricating a semiconductor device is provided, by which oxide on a Cu surface after via-etch can be removed using Hf (hafnium) as a barrier material. The method includes the steps of forming a Cu line in at least one protective insulating layer on a substrate, forming a via hole in the protective insulating layer to expose a portion of the Cu line, forming an Hf-containing layer in the via hole to cover the exposed portion of the embedded Cu line, and forming a conductive layer over the Hf-containing layer.

15 Claims, 2 Drawing Sheets

OTHER PUBLICATIONS

Jung Joo Kim; Method of Fabricating Semiconductor Device; U.S. Appl. No. 11/027,851, filed Dec. 29, 2004; 15 Pages and 2 Drawing Sheets; Assignee: DongbuAnam Semiconductor Inc.

Jung Joo Kim: Methods of Fabricating Via Hole and Trench; U.S. Appl. No. 11/027,435, filed Dec. 30, 2004; 10 Pages and 3 Drawing Sheets: Assignee: DongbuAnam Semiconductor Inc.

* cited by examiner

METHOD FOR FABRICATING SEMICONDUCTOR DEVICE

This application claims the benefit of the Korean Application No. P2003-0100978 filed on Dec. 30, 2003, which is hereby incorporated by reference.

BACKGROUND OF THE INVENTION

1. Field of the Invention

The present invention relates to a method of fabricating a semiconductor device, by which a Cu line having a Cu/Hf interface with excellent characteristics can be formed by using Hf (hafnium), an efficient oxygen scavenger or gatherer, to remove oxygen (in the form of a Cu oxide layer) adhering to the Cu line.

2. Discussion of the Related Art

Generally, Cu is a popular material in connecting metal lines. Yet, a top layer (i.e., a wiring portion between a bonding pad and a package on packaging) employs Al as it is. Since a Cu surface is very oxidizable, oxygen can diffuse into a lower metal layer through the oxidized Cu surface to trigger corrosion of Cu included in the lower layer. Moreover, it is well know that an Al pad is very advantageous for wiring on packaging.

FIG. 1 is a cross-sectional diagram of conventional Cu wiring. Referring to FIG. 1, a Cu line 11 is embedded in a first insulating layer 12. A second insulating layer 13 of oxide, nitride, or polymer is formed on the first insulating layer 12. A barrier layer 14 and an Al layer 15 are stacked on the Cu line 11 in turn. In this case, RF etch pre-cleaning or chemical wet cleaning is performed on the Cu line 11 to remove a Cu oxide layer from a surface of the Cu line 11.

However, the conventional metal wiring process sometimes fails to remove the oxide on the Cu surface, or at other times over-etches the Cu line to cause degradation to the Cu line in the lower layer.

SUMMARY OF THE INVENTION

Accordingly, the present invention is directed to a method of fabricating a semiconductor device that substantially obviates one or more problems due to limitations and disadvantages of the related art.

An object of the present invention is to provide a method of fabricating a semiconductor device, by which oxide on a Cu surface after via-etch can be thermodynamically removed (e.g., scavenged) using Hf (hafnium) as a barrier material.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a semiconductor device according to the present invention includes the steps of forming at least one protective insulating layer on a Cu line in a substrate, forming a via hole in the at least one protective insulating layer to expose a portion of the Cu line, forming an Hf layer in the via hole to cover the exposed portion of the embedded Cu line, and forming a conductive layer on the substrate including the Hf layer.

Preferably, the Hf layer is 50~500 Å thick.

Preferably, the Hf layer is formed by ionized physical vapor deposition.

Preferably, the method further includes the step of performing RF etch pre-cleaning using $Ar^+$ ions before forming the Hf layer. More preferably, the RF etch pre-cleaning removes a thickness of about 10~100 Å of the at least one protective insulating layer.

Preferably, an oxide layer formed on the exposed portion of the Cu line is reduced by the Hf layer.

Preferably, the conductive layer on the Hf layer comprises Al.

Preferably, the conductive layer forming step includes the steps of forming an $HfN_x$ layer on the Hf layer, forming a tungsten plug on the Hf layer in the via hole, and depositing Al over the substrate including the tungsten plug. More preferably, the HfNx layer is formed by rapid thermal annealing or furnace annealing.

Preferably, the conductive layer forming step includes the steps of depositing one selected from the group consisting of TiN, Ta, and TaN and forming a tungsten plug on the deposited one.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, the present invention relates to metallization structure and a method of forming a metal line on Cu wiring, and more particularly, to a method of removing a $CuO_x$ layer (e.g., a native oxide) formed on a Cu line at a bottom of a via hole without RF etching or otherwise pre-cleaning the via hole.

Namely, the present invention relates to a method of depositing a liner in a via hole, by which good via hole resistance can be secured by reducing $CuO_x$, avoiding substantial formation of oxides within the liner (e.g., Hf), and forming a conductive (e.g., metal) interface with underlying Cu by depositing Hf (hafnium) into the via hole and onto an exposed surface of Cu, instead of using the conventional RF etch pre-cleaning process.

Meanwhile, the present invention is characterized by use of a Hf-containing layer as a bonding and/or barrier layer. Hf, which is a metal having excellent reactivity with oxygen, reduces a $CuO_x$ layer that may exist at a via bottom after completion of a via etch without employing the conventional RF etch pre-cleaning, thereby providing a clean and/or conductive interface to a Cu surface to secure good Cu/Al interface resistance.

For the thermodynamic reduction of $CuO_x$ by Hf, the Gibbs energy of $HfO_2$ is −352 kJ/mol at 298 K, and the Gibbs energy of CuO is −297 kJ/mol at 298 K. Hence, oxygen of native $CuO_x$ is gathered into the Hf layer on the $CuO_x$ layer, whereby a clean surface can be provided to Cu. In case of depositing Hf, $CuO_x$ at the interface between the via bottom and the lower Cu line is effectively removed to secure low via resistance while a via etch profile can be maintained intact without via profile deformation or CD (critical dimension) expansion, which may result when using RF etch pre-cleaning to remove Cu oxides. Even if the Hf layer is thinner than about 50 Å on the bottom area, it is able to secure sufficient resistance thereof.

Figure 1:
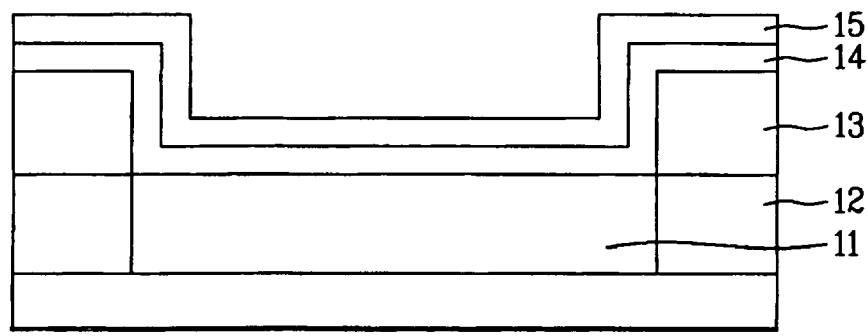
FIG. 1 is a cross-sectional diagram of conventional Cu wiring.
Figure 2A:
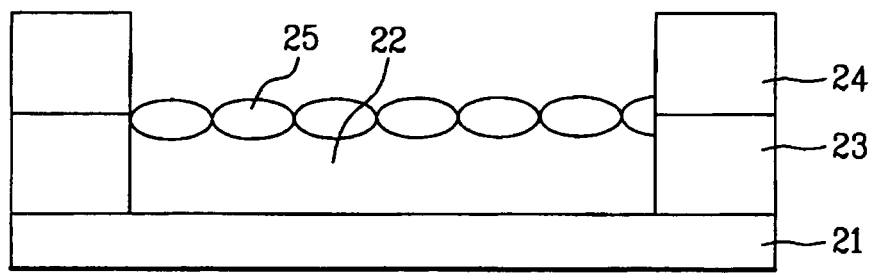
FIGS. 2A to 2D are cross-sectional diagrams for explaining a method of fabricating a semiconductor device.

FIGS. 2A to 2D are cross-sectional diagrams for explaining a method of fabricating a semiconductor device. Referring to FIG. 2A, by performing conventional deposition, photolithography, etching, deposition and planarization of various materials on a semiconductor substrate 21, a lower line 22 of Cu, a first insulating layer 23, and a second insulating layer 24 are patterned to form a via hole communicating through line 22 with a pad (not shown). However, a step of removing $CuO_x$ 25 formed on a bottom of the via hole is needed prior to forming a via plug.

Figure 2B:
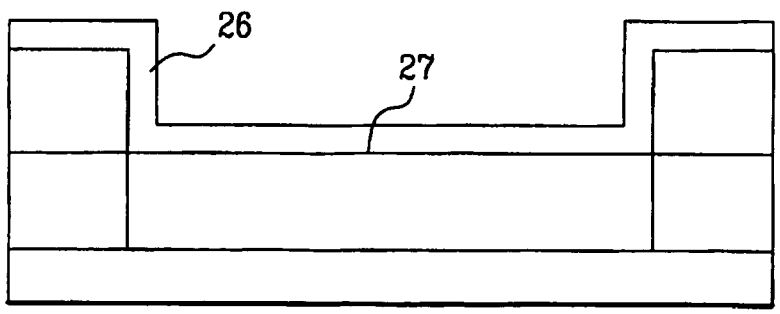

Referring to FIG. 2B, instead of employing conventional wet or dry pre-cleaning, a Hf-containing layer 26 for reducing Cu in the Cu oxide layer is deposited 50~500 Å thick on the structure shown in FIG. 2A by PVD (physical vapor deposition) or sputtering from a Hf target. Typically, the deposition temperature is from about 0° C. to about 600° C. In this case, the deposited Hf layer 26, the oxide of which is thermodynamically more stable than the native $CuO_x$ layer, reduces $CuO_x$ to Cu and the gathered or scavenged oxygen dissolves in the Hf layer (rather than forming a Hf oxide layer) and diffuses throughout the Hf layer, whereby a Cu/Hf interface 27 can provide good via resistance. However, liner layer 26 generally contains Hf and some small percentage of dissolved oxygen; thus, it is can be characterized as an "Hf-containing" layer, in that it may contain other materials as well (including, for example, nitrogen and/or other metals having characteristics similar to Hf).

Figure 2C:
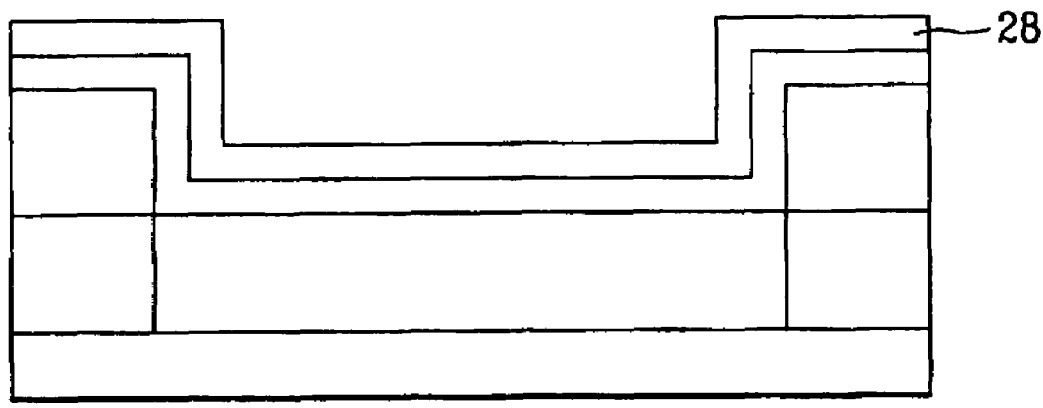

Referring to FIG. 2C, an Al or Cu layer 28 may be directly deposited on the Hf-containing layer to form a metal line 28. As will be explained below, Al or Cu layer 28 may further contain a conventional diffusion barrier layer underneath, between it and the deposited Hf-containing layer 26.

Figure 2D:
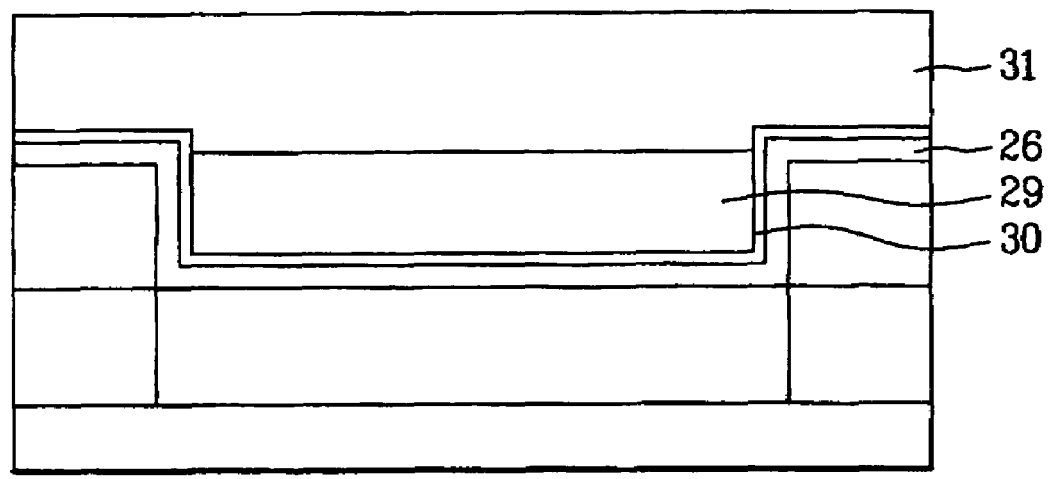

Referring to FIG. 2D, in the case of forming a tungsten (W) plug 29 in the via hole, $Hf/HfN_x$ are preferentially formed as bonding and barrier layers, respectively, by rapid thermal annealing or furnace annealing the Hf layer 26 in a nitrogen (e.g., $N_2$) ambient to convert a surface of the Hf layer into a $HfN_x$ layer 30. Preferably, $HfN_x$ layer 30 consists essentially of HfN and/or $Hf_3N_4$. Subsequently, the tungsten plug 29 is formed in the via hole. Namely, when the $HfN_x$ layer formed by annealing plays a role as the diffusion barrier layer, the tungsten plug 29 is formed on the $HfN_x$ layer by CVD. An Al layer 31 is then formed over the substrate including the tungsten plug 29 to complete the metal wiring. Alternatively, tungsten plug 29 and Al layer 31 can be replaced with conventional (damascene or dual damascene) copper metallization.

Alternatively, the $HfN_x$ layer can be formed by depositing $HfN_x$ by PVD using ionized metal plasma (IMP) or sputtering (e.g., from a $HfN_x$ target or by PVD of Hf in an atmosphere containing nitrogen or ammonia), by CVD or atomic layer deposition (ALD) in-situ under a high vacuum state (e.g., from $HfCl_4$, $Hf(O-t-Bu)_4$, or tetrakis(di-$C_1$–$C_4$-alkylamido)hafnium in an atmosphere containing ammonia), or depositing $HfN_x$ by ex-situ (by either of the above methods) in another chamber or equipment (after vacuum break) to be used as a barrier layer for the Al and/or tungsten plug.

Alternatively, a TiN, Ta, or TaN diffusion barrier layer may be formed on the Hf layer 26 in the same manner as the $HfN_x$ film above to configure a Hf/TiN, Hf/Ta, or Hf/TaN structure. In depositing Hf, a deposition temperature is set between room temperature and 400° C., and annealing (e.g., at 300–400° C. for 1–30 minutes) is performed to reduce $CuO_x$.

Alternatively, the Hf or $HfN_x$ layer can be formed by ionized PVD in which Hf is ionized for deposition on the Cu oxide layer by PVD (wherein formation of $HfN_x$ may comprise ionized PVD of Hf in a nitrogen ambient). In doing so, acceleration and straight drivability of the ionized Hf are improved relative to regular PVD or sputtering so that reduction of the Cu oxide layer can be attained (or activated) by physical impact or the like on depositing the $Hf/HfN_x$ layer on the Cu oxide layer.

Alternatively, the Hf or $HfN_x$ layer can be formed or deposited after completion of RF etch pre-cleaning. In doing so, Hf may be deposited after minimizing an RF etch time, to minimize the via profile deformation caused by $Ar^+$ ions during the RF etch. Namely, the reduction property of the Hf layer can be enhanced after Cu oxide has been activated by the $Ar^+$ ions. In performing the RF etch, a removal thickness is set to 10~100 Å with reference to a thermal silicon oxide ($SiO_x$) of the first or second insulating layer. Hence, a minimal physical bombardment of the Cu oxide layer during RF etch pre-cleaning may be sufficient to activate the reduction thereof by the Hf layer, as well as to minimize the via profile deformation.

Accordingly, the present invention removes Cu oxide prior to the via plug formation using Hf deposition instead of etch pre-cleaning, thereby preventing or minimizing (1) an increase in the critical dimension (CD) of the via hole by the dry etch pre-cleaning and (2) encroachment of the Cu oxide along the Cu surface. Furthermore, the present invention enables maintaining the via CD as designed, prevents the via bottom area from being increased by the cleaning solution during a wet etch pre-clean, and prevents oxygen or moisture from diffusing to the Cu wiring through the pad (due to the oxygen scavenging properties of the Hf layer).

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising the steps of:
   forming at least one protective insulating layer on a Cu line in a substrate;
   forming a via hole in the at least one protective insulating layer to expose a portion of the Cu line;

forming a layer comprising Hf in the via hole to cover the exposed portion of the Cu line; and forming a conductive layer comprising an HfNx layer over the substrate, on the Hf-containing layer.

2. The method of claim 1, wherein the Hf-containing layer has a thickness of from about 50 to about 500 Å.

3. The method of claim 1, wherein the step of forming the Hf-containing layer comprises ionized physical vapor depositing Hf or an Hf precursor.

4. The method of claim 1, wherein an oxide layer on the exposed portion of the embedded Cu line is reduced by the Hf-containing layer.

5. The method of claim 1, wherein the HfNx layer-forming step comprises rapid thermal annealing or furnace annealing.

6. The method of claim 1, further comprising the step of performing RF etch pre-cleaning using Ar+ ions before forming the Hf-containing layer.

7. The method of claim 6, wherein the RF etch pre-cleaning removes a thickness of from about 10 to abut 100 Å of the at least one protective insulating layer.

8. The method of claim 1, wherein the conductive layer forming step further comprises a step of forming a tungsten plug on the HfNx layer in the via hole.

9. The method of claim 8, wherein the conductive layer forming step further comprises a step of:

depositing Al over the substrate including the tungsten plug.

10. A metallization structure for a semiconductor device, comprising:

a Cu line in a substrate;

at least one protective insulating layer having a via hole therein to expose a portion of the Cu line;

a layer comprising Hf in the via hole to cover the exposed portion of the Cu line; and a conductive layer comprising an HfNx barrier layer on the Hf-containing layer.

11. The metallization structure of claim 10, wherein the Hf-containing layer has a thickness of from about 50 to about 500 Å.

12. The metallization structure of claim 10, wherein the conductive layer further comprises Al and/or Cu.

13. The metallization structure of claim 10, wherein the conductive layer further comprises Cu.

14. The metallization structure of claim 10, wherein the conductive layer further comprises Al.

15. The metallization structure of claim 14, wherein the conductive layer further comprises a tungsten plug between the Al and the HfNx barrier layer.

* * * * *